United States Patent
Choi

(10) Patent No.: US 7,450,465 B2
(45) Date of Patent: *Nov. 11, 2008

(54) READ COMMAND TRIGGERED SYNCHRONIZATION CIRCUITRY

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/811,290

(22) Filed: Jun. 8, 2007

(65) Prior Publication Data

US 2008/0019197 A1    Jan. 24, 2008

Related U.S. Application Data

(63) Continuation of application No. 10/922,429, filed on Aug. 19, 2004, now Pat. No. 7,245,551.

(51) Int. Cl.
*G11C 8/00* (2006.01)

(52) U.S. Cl. .................................. 365/233.1; 365/227
(58) Field of Classification Search ................. 365/233, 365/227, 236
See application file for complete search history.

(56) References Cited

U.S. PATENT DOCUMENTS

| | | | | |
|---|---|---|---|---|
| 6,166,990 A | * | 12/2000 | Ooishi et al. | 365/233.11 |
| 6,417,715 B2 | * | 7/2002 | Hamamoto et al. | 327/291 |
| 6,677,791 B2 | * | 1/2004 | Okuda et al. | 327/158 |
| 6,754,746 B1 | * | 6/2004 | Leung et al. | 710/100 |

* cited by examiner

*Primary Examiner*—Vu A Le
(74) *Attorney, Agent, or Firm*—Ropes & Gray LLP

(57) ABSTRACT

A memory READ command triggered clock synchronization mode turns on a clock synchronization circuit only for memory READ operations. The clock synchronization circuit achieves a signal lock with the reference clock signal in less time than the column address strobe latency. Precise memory READ operations are thus possible without wasting power when such operations are not performed by allowing the clock synchronization circuitry to be turned off.

20 Claims, 7 Drawing Sheets

READ COMMAND TRIGGERED SYNCHRONIZATION CIRCUITRY

CROSS REFERENCE TO RELATED APPLICATION

This is a continuation of commonly-assigned U.S. patent application Ser. No. 10/922,429, filed Aug. 19, 2004, now U.S. Pat. No. 7,245,551, which is are hereby incorporated by reference herein in its entirety.

BACKGROUND OF THE INVENTION

This invention relates to clock synchronization circuitry in high speed integrated circuit memory devices. More particularly, this invention relates to clock synchronization circuitry that is turned on only for memory READ operations.

Clock synchronization circuitry is used in high-speed memory devices to reduce phase variations in clock signals. As the speed of memory increases, memory access time decreases. Even small variations in the phase of a clock signal, such as those variations caused by changes in the power, voltage, or temperature of the circuit, can have significant effects on memory access timing. Clock synchronization circuits such as, for example, a delay-locked loop (DLL) circuit can be used to reduce or ideally eliminate these phase variations in the clock signal.

A DLL uses a variable delay line to add phase delay to an input reference clock signal before the signal is output from the DLL. The DLL uses a phase detector to measure the phase difference between the output of the DLL and the reference clock. The variable delay line is then adjusted to obtain the desired phase difference, which is usually zero.

Although clock synchronization circuits make high-speed memory access more reliable by minimizing phase variations in the clock signal, they increase the power consumption of memory devices. Typically, a clock synchronization circuit runs continuously and consumes power even when the synchronized clock signal is not needed. Even in a stand-by or power-down state, when most other memory control logic is turned off to reduce power consumption, the clock synchronization circuitry is typically not turned off. Such circuitry is not turned off because a delay of multiple clock cycles is usually required before a valid synchronized clock signal can be output after the synchronization circuitry is turned on. Thus, the synchronization circuitry is run continuously so that a valid synchronized clock signal is available at all times.

In view of the forgoing, it would be desirable to be able to provide clock synchronization circuitry that only needs to be on when a synchronized clock output is needed (e.g., for high-speed memory READ operations) and that can be turned off when it is not.

SUMMARY OF THE INVENTION

It is an object of this invention to provide clock synchronization circuitry that can be turned on only when needed to provide a synchronized clock signal and that can be turned off when it is not.

In accordance with the invention, clock synchronization circuitry is provided with a READ command triggered clock synchronization mode. The READ command triggered clock synchronization mode turns the clock synchronization circuitry on upon receipt of a READ command. A valid synchronized clock signal is output in less time than the column address strobe (CAS) latency, thus allowing the READ operation to be properly performed. CAS latency is the amount of time needed from the moment the memory controller receives a memory address to be read until the data at that memory address is ready to be read.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

This invention provides a memory READ command triggered clock synchronization mode in which clock synchronization circuitry is turned on only when needed to provide a synchronized clock signal for reading data from memory. At other times, the synchronization circuitry can be off.

Figure 1:
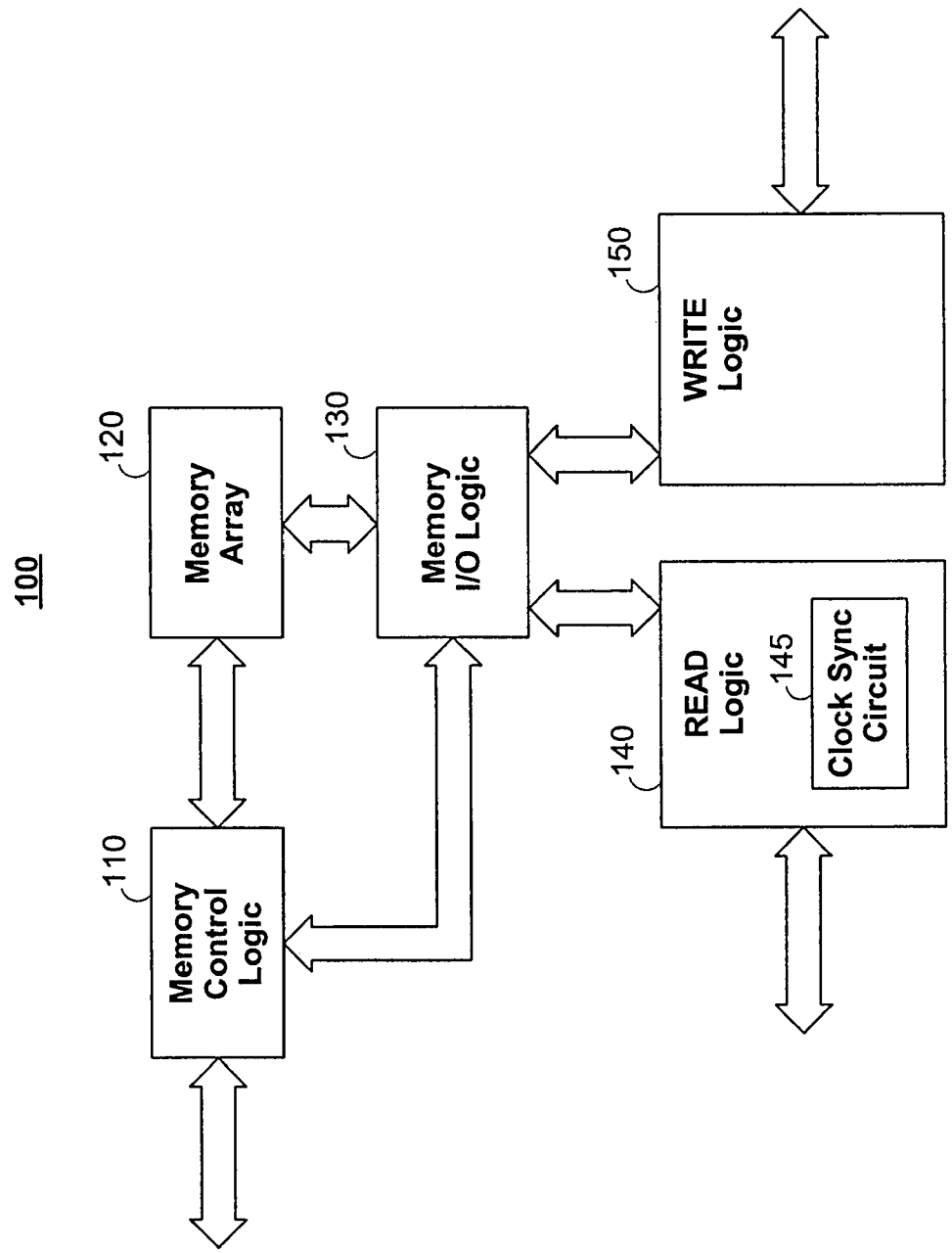
FIG. 1 is a block diagram of a typical high-speed memory device.

FIG. 1 shows a typical high-speed memory device 100. High-speed memory device 100 typically includes control logic 110, memory array 120, I/O logic 130, READ logic 140, which includes clock synchronization circuit 145, and WRITE logic 150. Control logic 110 receives control and address signals and coordinates the operation of memory device 100. I/O logic 130, READ logic 140, and WRITE logic 150 control the reading and writing of data from memory array 120.

Clock synchronization circuit 145, which typically includes a delay-locked loop (DLL), receives reference clock signals and continuously outputs synchronized clock signals. The synchronized clock signals are used to provide precise timing for the high-speed memory READ operations.

Figure 2:
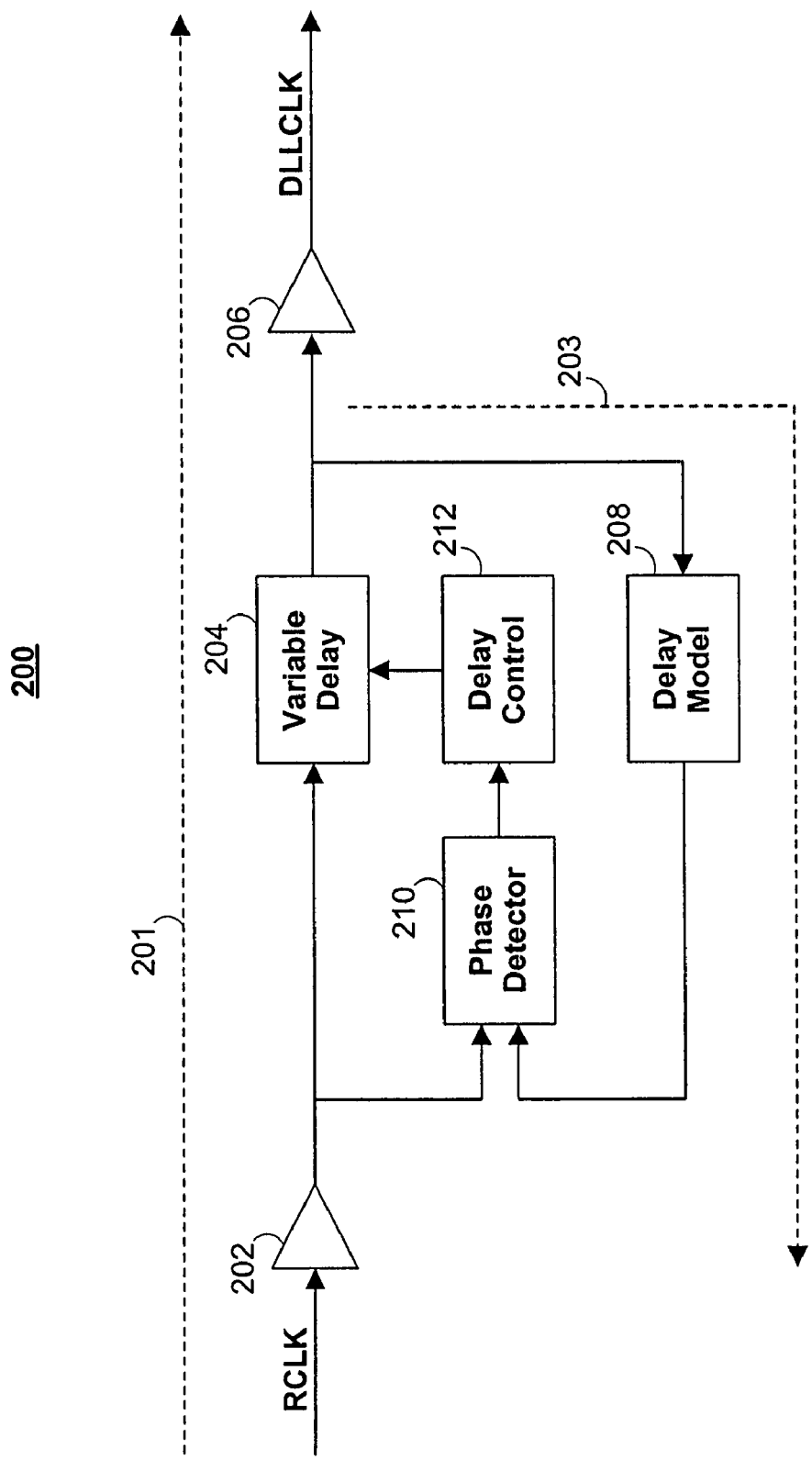
FIG. 2 is a block diagram of a typical delay-locked loop (DLL)

FIG. 2 shows a typical delay-locked loop (DLL) synchronization circuit 200. Reference clock signal RCLK is input to DLL 200, and output signal DLLCLK is a delayed, synchronized version of clock signal RCLK. The phase difference between RCLK and DLLCLK is ideally zero.

DLL 200 typically includes input buffer 202, variable delay 204, output buffer 206, delay model 208, phase detector 210, and delay control 212. Following forward signal path 201, reference clock signal RCLK enters variable delay 204 via input buffer 202. Input buffer 202 delays the input clock signal RCLK by delay D1. Variable delay 204 adds an adjustable amount of delay and outputs the clock signal through output buffer 206 as DLL output signal, DLLCLK. Output buffer 206 delays the clock signal by delay D2. Delay D2 may also include other delays at the output of DLL 200, such as, for example, a clock distribution tree delay or output driver delay.

Variable delay 204 is ideally set to a value that causes DLLCLK to be in phase with RCLK. In order for DLLCLK to be in phase with RCLK, the total delay of forward signal path 201 should be a multiple of the clock period $t_{ck}$ (i.e., the delay is set equal to $N*t_{ck}$, where N is a whole number greater than or equal to 1). Thus, the delay of variable delay 204 is ideally set to $N*t_{ck}-(D1+D2)$ (i.e., the total desired delay minus the approximated delay of input and output buffers 202 and 206).

Following feedback signal path 203, the output of variable delay 204 is fed back through delay model 208 to phase detector 210. Delay model 208 "models" the approximate delay of (D1+D2) (i.e., the sum of the approximate delays of input buffer 202 and output buffer 206). The sum of the delays of variable delay 204 and delay model 208 is ideally equal to the delay of forward signal path 201 (i.e., $N*t_{ck}$).

Phase detector 210 measures the phase difference between reference input clock signal RCLK and synchronized output clock signal DLLCLK. Phase detector 210 controls delay control 212, which adjusts the delay of variable delay 204. Variable delay 204 is adjusted to minimize, if not eliminate, the phase difference measured by phase detector 210 between RCLK and DLLCLK. After variable delay 204 has been adjusted to its optimal setting, the DLL is said to be locked.

Figure 3:
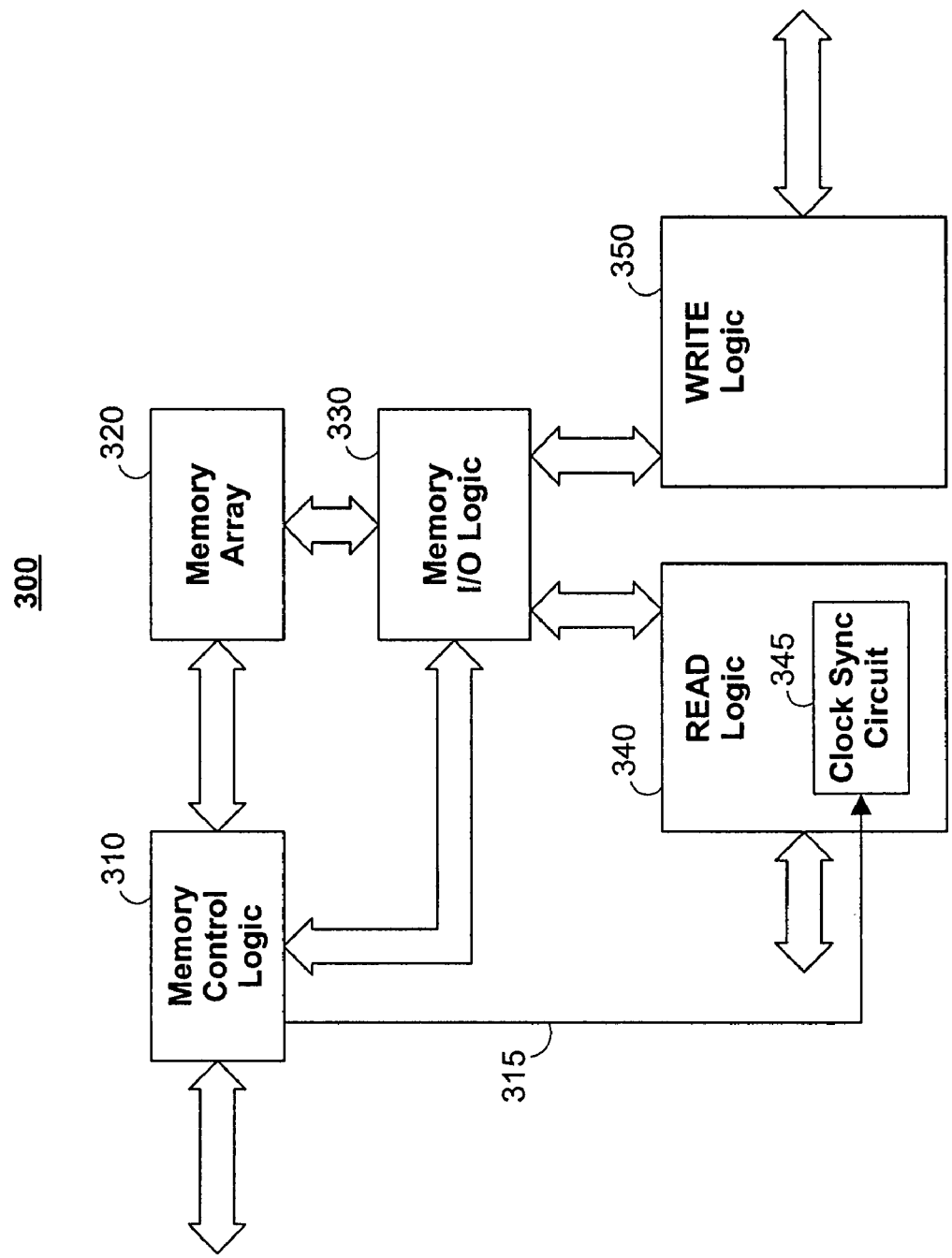
FIG. 3 is a block diagram of a high-speed memory device with a READ command triggered clock synchronization mode according to the invention.

FIG. 3 shows high-speed memory device 300 in accordance with the invention. Memory device 300 may be, for example, a dynamic random access memory (DRAM). As in high-speed memory device 100, high-speed memory device 300 includes control logic 310, memory array 320, I/O logic 330, READ logic 340, which includes clock synchronization circuit 345, and WRITE logic 350, which all operate similarly or identically to their corresponding counterparts in high-speed memory device 100. High speed memory device 300 also preferably includes control signal line 315.

Control signal line 315 advantageously allows control logic 310 to turn on and off clock synchronization circuit 345. For example, when control logic 310 receives a memory READ command and begins performing a memory READ operation, it can turn on clock synchronization circuit 345 with a control signal on line 315 to produce a synchronized clock output signal. Control logic 310 can then turn off clock synchronization circuit 345 after the READ operation is complete. Thus, clock synchronization circuit 345 can be advantageously turned on only when a synchronized clock output signal is needed by READ logic 340.

After clock synchronization circuit 345 is turned on by control signal 315, clock synchronization circuit 345 locks onto the reference clock signal input and outputs a synchronized output clock signal. This should be complete before READ logic 340 begins reading data from memory. In other words, the time required for clock synchronization circuit 345 to turn on and produce a synchronized output clock signal should be less than the column address strobe (CAS) latency. CAS latency is not very scalable and has not decreased as much as other timings related to memory access time. Thus, as memory speed has increased, CAS latency has become a larger proportion of the total memory access time.

Known DLL 200 may not be able to turn on and lock to a reference clock signal as quickly as is required in memory device 300, because several complete cycles through the DLL feedback loop may be needed before a locked synchronized output clock signal is produced.

However, other types of clock synchronization circuits may be used in high-speed memory device 300 in place of a typical DLL. For example, a synchronous mirror delay (SMD) is one type of clock synchronization circuit that has a shorter locking time than a typical DLL.

Figure 4:
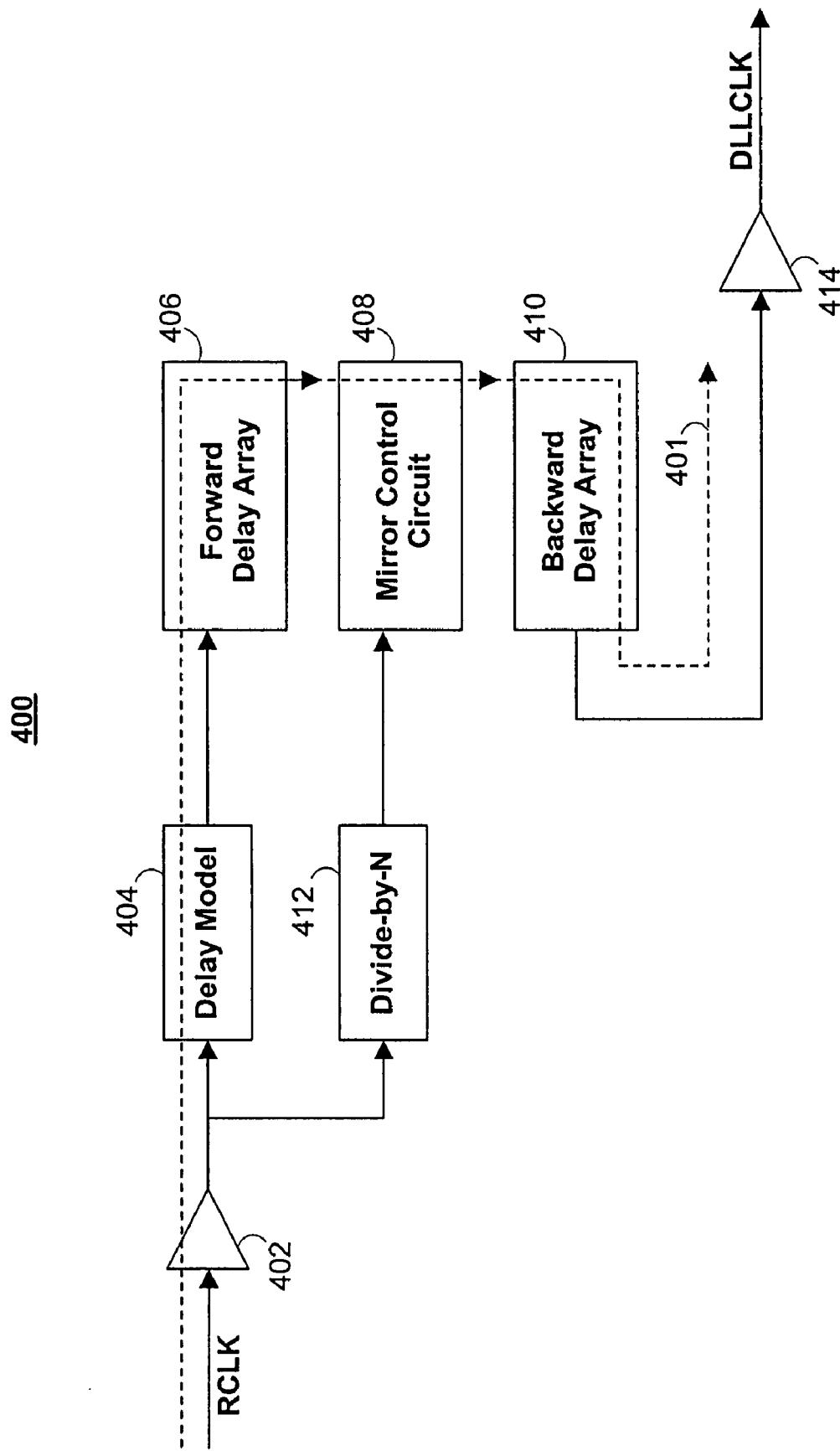
FIG. 4 is a block diagram of a typical measure controlled delay (MCD)

FIG. 4 illustrates a typical SMD 400, which includes input buffer 402, delay model 404, forward delay array 406, mirror control circuit 408, backward delay array 410, divide-by-N counter 412, and output buffer 414.

Forward delay array 406 and backward delay array 410 are made up of a series of delay elements. Ideally, the delay characteristics of forward delay array 406 and backward delay array 410 are identical. Forward delay array 406 has a series of parallel outputs corresponding respectively to each delay element, and backward delay array 410 has a series of parallel inputs corresponding respectively to each of its delay elements. After a clock signal is input to forward delay array 406, it begins to propagate through the delay elements. When the clock signal reaches the Kth delay element, mirror control circuit 408, driven by divide-by-N counter 412, causes the clock signal to be output from the Kth delay element of forward delay array 406 and input to the Kth delay element of backward delay array 410. After the clock signal is input to backward delay array 410, it propagates through the same number of delay elements as it did in forward delay array 406 before exiting backward delay array 410. Ideally, the clock signal delay introduced by forward delay array 406 is equal to the delay introduced by backward delay array 410 and the total array delay is equal to $2*(t_{ck}-(D1+D2))$ In forward signal path 401 of SMD 400, reference clock signal RCLK is input through input buffer 402 and delay model 404 and enters forward delay array 406. Input and output buffers 402 and 414 and delay model 404 have respectively similar delay characteristics as in the previously described DLL circuitry. After divide-by-N counter 406 counts N clock cycles, it triggers mirror control circuit 408. The number N is based on the length of the delay array and speed of the clock signal. N may be fixed by the design of the clock synchronization circuitry or may be variable. Mirror control circuit 408 causes the clock signal in forward delay array 406 to be transferred to backward delay array 410. After N more clock cycles, the synchronized output clock signal is output through output buffer 414.

SMD 400 outputs a synchronized clock output signal more quickly than DLL 200, because unlike DLL 200, SMD 400 does not need multiple feedback cycles to lock its output to a reference clock signal.

Note that the present invention can use other types of clock synchronization circuitry that can lock quickly to a reference clock signal. These include an SMD, a measure controlled delay (MCD), a phase-locked loop (PLL), or even a fast-locking DLL. As memory speeds increase and CAS latency becomes a relatively longer portion of the read access time, clock synchronization circuits will have more clock cycles in which to lock the reference clock.

Figure 5:
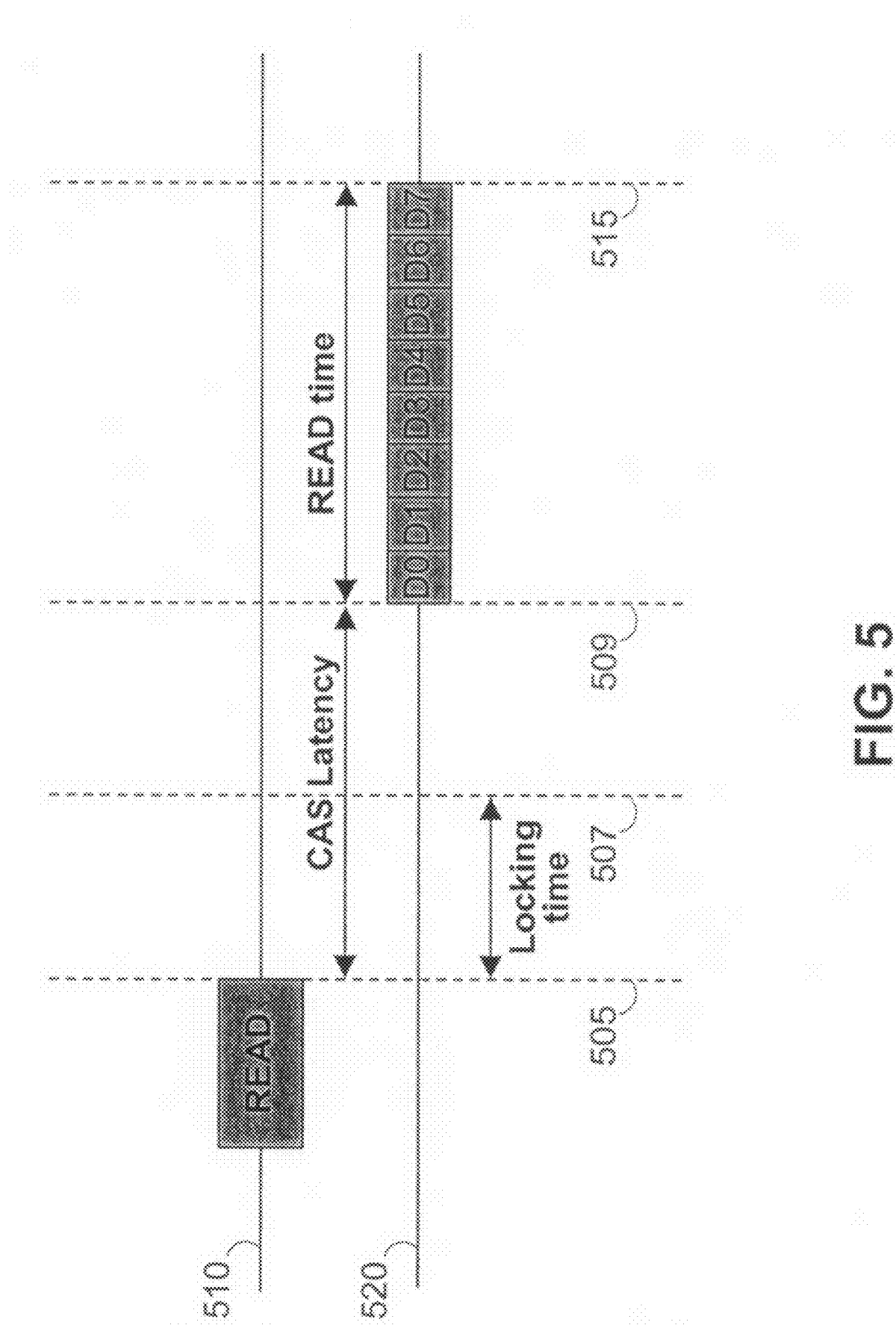
FIG. 5 is a timeline illustration of a READ operation according to the invention.

FIG. 5 shows a timeline of a READ operation in a memory device according to the invention. Line 510 represents the command bus of the memory device, and line 520 represents the data bus of the memory device. At time 505, a READ command is received on the command bus. In response to the READ command, the clock synchronization circuitry is turned on. The time period between time 505 and time 515 represents the total memory access time. This time may be divided into the CAS latency time (time 505 to time 509) and the data read time (time 509 to time 515). As shown, the locking time of the clock synchronization circuit is from time 505 to time 507. As long as the locking time is less than the CAS latency time, a synchronized clock signal will be available during the data read time. After time 515 (i.e., after the data read has been completed), the clock synchronization circuit can be advantageously turned off until the next READ command is received.

Figure 6:
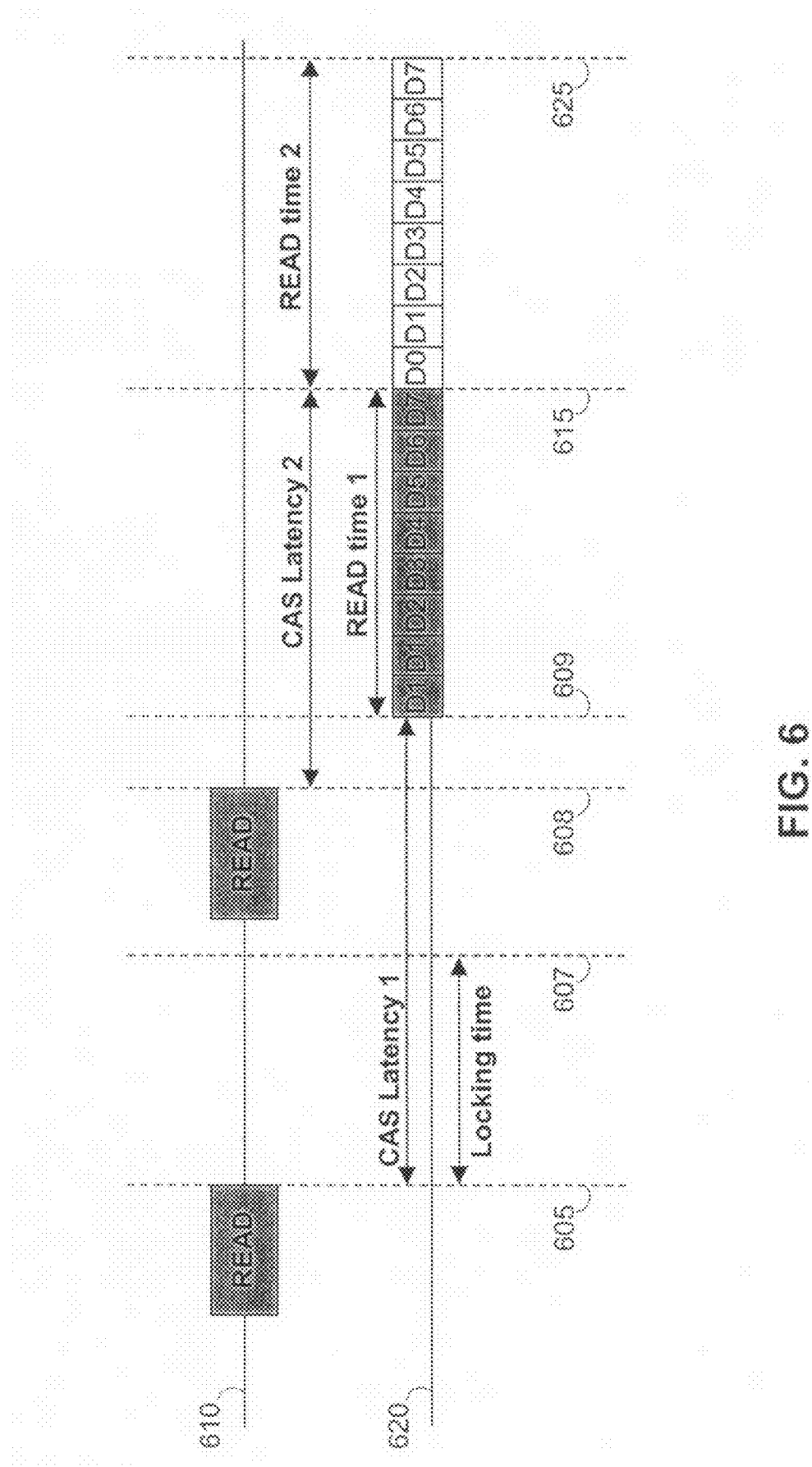
FIG. 6 is a timeline illustration of two consecutive READ operations according to the invention.

FIG. 6 shows a timeline of consecutive READ operations in a memory device according to the invention. Line 610 represents the command bus of the memory device, and line 620 represents the data bus of the memory device. At time 605, a first READ command is received on the command bus. As in the example of FIG. 5, the clock synchronization circuitry is turned on in response to the READ command. The time period between time 605 and time 615 represents the total memory access time for the first READ command. A second READ command is received at time 608, before the end of the CAS latency period of the first READ operation. The second and any additional consecutive READ operations extend the time that the clock synchronization circuit is active by the CAS latency period plus the data read time. Thus, rather than turn off the clock synchronization circuit after the first READ operation at time 615, and immediately turn it back on for the second READ operation, the clock synchronization circuit may be left on for the entire duration of all consecutive READ operations. After time 625, which is when both READ operations have been completed, the clock synchronization circuit can be turned off until the next READ command is received.

Alternatively, the clock synchronization circuit may be turned on and off according to different operating modes. For example, in addition to the embodiments discussed above (wherein (1) the clock synchronization circuitry is turned on for each READ operation and turned off afterward, and (2) the clock synchronization circuitry remains on for consecutive READ operations), clock synchronization circuitry may also remain on for a period of time after each READ operation. Or, the clock synchronization circuitry may be turned on and off according to the operation of the memory device. For example, when the memory device is active and many READ commands are received in a certain period of time, the clock synchronization circuitry may remain on. When the memory device is less active and fewer READ commands are received, the clock synchronization circuitry may then be turned on and off as needed for each read operation.

Further, the operating mode of the clock synchronization circuitry may be controlled in accordance with the operating speed of the memory device. When the memory device is operating at a speed at which the CAS latency period is greater than the locking time of the clock synchronization circuit, the clock synchronization circuit can be switched on and off as needed. However, when the locking time exceeds the CAS latency period, the clock synchronization circuit should be left on.

Figure 7:
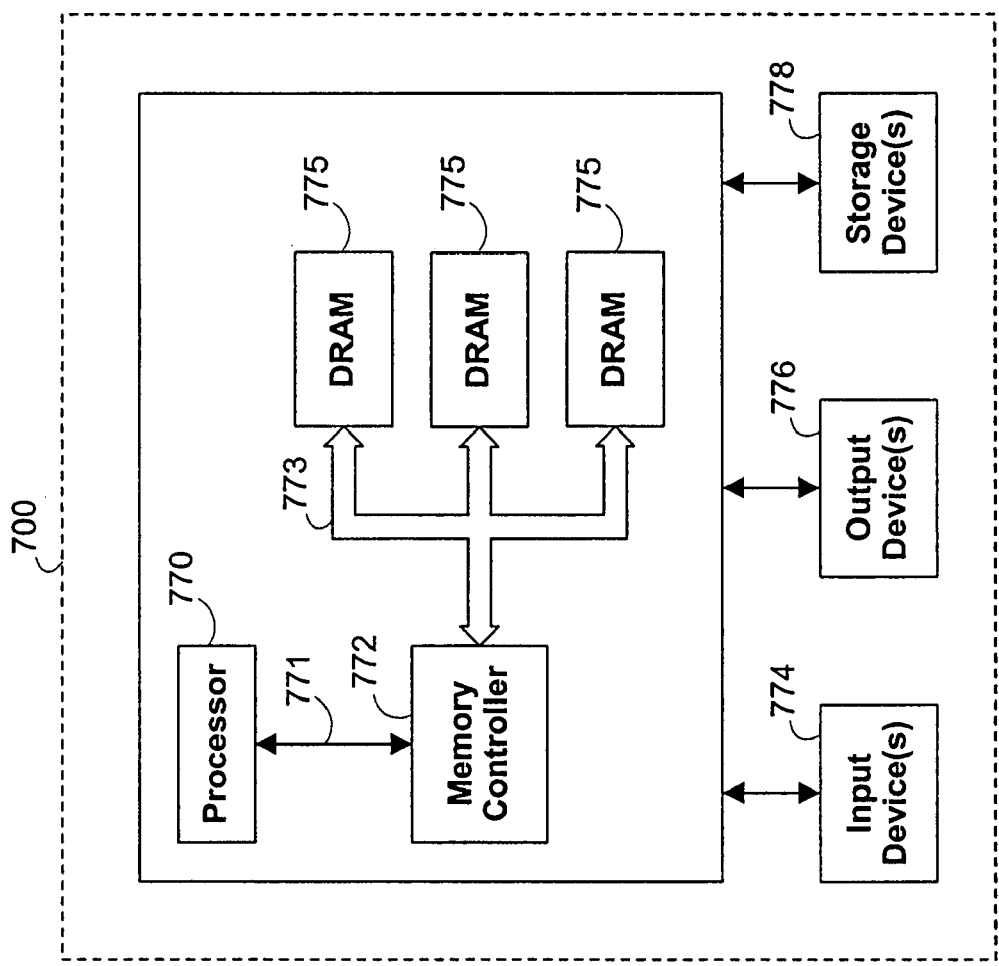
FIG. 7 is a block diagram of a system that incorporates the invention.

FIG. 7 shows a system that incorporates the invention. System 700 includes a plurality of DRAM chips 775, a processor 770, a memory controller 772, input device(s) 774, output device(s) 776, and optional storage device(s) 778. Data and control signals are transferred between processor 770 and memory controller 772 via bus 771. Similarly, data and control signals are transferred between memory controller 772 and DRAM chips 775 via bus 773. Input device(s) 774 can include, for example, a keyboard, a mouse, a touch-pad display screen, or any other appropriate device that allows a user to enter information into system 700. Output device(s) 776 can include, for example, a video display unit, a printer, or any other appropriate device capable of providing output data to a user. Note that input device(s) 774 and output device(s) 776 can alternatively be a single input/output device. Storage device(s) 778 can include, for example, one or more disk or tape drives.

One or more DRAM chips 775 include a READ command triggered synchronization mode in accordance with the invention. A READ command triggered synchronization mode may also be included in memory controller 772. Moreover, a READ command triggered synchronization mode in accordance with the invention may be included in any part of the system that uses clock synchronization circuitry. This READ command triggered synchronization mode allows the system to operate accurately at high clock speeds while consuming less power.

Note that the invention is not limited to use in DRAM chips or memory systems, but is applicable to other systems and integrated circuits that use clock synchronization circuits.

Thus it is seen that a READ command triggered synchronization mode is provided, allowing the clock synchronization circuitry to be turned off when not needed. One skilled in the art will appreciate that the invention can be practiced by other than the described embodiments, which are presented for purposes of illustration and not of limitation, and the present invention is limited only by the claims which follow.

I claim:

1. A method of controlling a memory device, said method comprising:
   receiving a first command to read first data;
   turning on a clock synchronization circuit at least partially in response to the first command; and
   receiving a second command to read second data,
   wherein the clock synchronization circuit is not turned off after reading the first data if the second command is received before the first data is ready to be read.

2. The method of claim 1, wherein the first data is ready to be read at an end of a column address strobe (CAS) latency period.

3. The method of claim 1, wherein the clock synchronization circuitry is turned off after the second data is read.

4. The method of claim 1, wherein the clock synchronization circuitry comprises a synchronous mirror delay.

5. The method of claim 1, wherein the clock synchronization circuitry comprises a measure controlled delay.

6. The method of claim 1, wherein the clock synchronization circuitry comprises a phase-locked loop.

7. The method of claim 1, wherein the clock synchronization circuitry comprises a delay-locked loop.

8. A method of controlling a memory device, said method comprising:
   receiving a first read command;
   turning on a clock synchronization circuit at least partially in response to the first read command; and
   receiving a second read command,
   wherein the clock synchronization circuit is kept on when the second read command is received before the clock synchronization circuit is turned off.

9. The method of claim 8, wherein the first data is ready to be read at an end of a column address strobe (CAS) latency period.

10. The method of claim 8, wherein the clock synchronization circuitry is turned off after the second data is read.

11. The method of claim 8, wherein the clock synchronization circuitry comprises a synchronous mirror delay.

12. The method of claim 8, wherein the clock synchronization circuitry comprises a measure controlled delay.

13. The method of claim 8, wherein the clock synchronization circuitry comprises a phase-locked loop.

14. The method of claim 8, wherein the clock synchronization circuitry comprises a delay-locked loop.

15. A method of controlling a memory device, said method comprising:
   receiving a command to read data; and
   turning on a clock synchronization circuit at least partially in response to the command, wherein an output clock signal of the clock synchronization circuit is synchronized with a reference clock signal in less time than a column address strobe (CAS) latency period of the memory.

16. The method of claim 15, wherein the clock synchronization circuitry is turned off after the data is read.

17. The method of claim 15, wherein the clock synchronization circuitry comprises a synchronous mirror delay.

18. The method of claim 15, wherein the clock synchronization circuitry comprises a measure controlled delay.

19. The method of claim 15, wherein the clock synchronization circuitry comprises a phase-locked loop.

20. The method of claim 15, wherein the clock synchronization circuitry comprises a delay-locked loop.

* * * * *

UNITED STATES PATENT AND TRADEMARK OFFICE
CERTIFICATE OF CORRECTION

PATENT NO. : 7,450,465 B2  Page 1 of 1
APPLICATION NO. : 11/811290
DATED : November 11, 2008
INVENTOR(S) : Choi It is certified that error appears in the above-identified patent and that said Letters Patent is hereby corrected as shown below:

In column 1, line 9, after "is" delete "are".

In column 1, lines 9–10, delete "incorporated by reference herein" and insert -- incorporated herein by reference --, therefor.

Signed and Sealed this

Twenty-fourth Day of February, 2009

JOHN DOLL
*Acting Director of the United States Patent and Trademark Office*